(12) United States Patent
Furuta

(10) Patent No.: US 7,687,901 B2
(45) Date of Patent: Mar. 30, 2010

(54) HEAT DISSIPATING FINS OPPOSITE SEMICONDUCTOR ELEMENTS

(75) Inventor: Norifumi Furuta, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 234 days.

(21) Appl. No.: 11/795,132

(22) PCT Filed: Jan. 20, 2006

(86) PCT No.: PCT/JP2006/301271

§ 371 (c)(1),
(2), (4) Date: Jul. 12, 2007

(87) PCT Pub. No.: WO2006/078070

PCT Pub. Date: Jul. 27, 2006

(65) Prior Publication Data

US 2008/0093730 A1    Apr. 24, 2008

(30) Foreign Application Priority Data

Jan. 24, 2005  (JP)  ............................. 2005-015744
Jun. 29, 2005  (JP)  ............................. 2005-189526

(51) Int. Cl.
*H01L 23/46* (2006.01)
*H01L 23/433* (2006.01)

(52) U.S. Cl. .............. 257/712; 257/713; 257/722; 257/730; 257/E23.09; 257/E23.101; 257/E23.097; 257/E25.016

(58) Field of Classification Search ............... None
See application file for complete search history.

(56) References Cited

U.S. PATENT DOCUMENTS

| 5,763,950 | A  | * | 6/1998 | Fujisaki et al. | ............... 257/712 |
| 5,844,313 | A  |   | 12/1998 | Hoffmann |  |
| 6,542,365 | B2 | * | 4/2003 | Inoue | ........................ 361/699 |
| 2001/0033477 | A1 |   | 10/2001 | Inoue et al. |  |
| 2004/0118501 | A1 |   | 6/2004 | Chiu et al. |  |

FOREIGN PATENT DOCUMENTS

| DE | 39 27 866 A1 | 3/1990 |
| DE | 44 18 611 A1 | 2/1995 |
| DE | 196 35 468 A1 | 3/1998 |
| EP | 1 172 850 A2 | 1/2002 |
| EP | 1 280 202 A2 | 1/2003 |

(Continued)

OTHER PUBLICATIONS

Technology Report No. 2003-504490, the Japan Institute of Invention and Innovation, Jul. 31, 2003.

*Primary Examiner*—Kenneth A Parker
*Assistant Examiner*—David Spalla
(74) *Attorney, Agent, or Firm*—Oliff & Berridge, PLC

(57) ABSTRACT

Electrode plates acting as a heat sink are arranged to sandwich a power transistor and a diode. Electrode plates at their surfaces opposite cooling elements at a portion opposite power transistor and diode are formed to be smaller in thickness at a portion adjacent to power transistor and diode substantially at the center than at a periphery. Cooling elements are disposed geometrically along electrode plates to sandwich electrode plates.

5 Claims, 10 Drawing Sheets

FOREIGN PATENT DOCUMENTS

| | | |
|---|---|---|
| GB | 2 222 721 A | 3/1990 |
| GB | 2 280 989 A | 2/1995 |
| JP | A-04-372159 | 12/1992 |
| JP | A-07-189684 | 7/1995 |
| JP | A-07-318296 | 12/1995 |
| JP | A-2000-307042 | 11/2000 |
| JP | A-2001-196775 | 7/2001 |
| JP | A-2003-046046 | 2/2003 |
| JP | A-2003-204019 | 7/2003 |

* cited by examiner

HEAT DISSIPATING FINS OPPOSITE SEMICONDUCTOR ELEMENTS

TECHNICAL FIELD

The present invention relates generally to semiconductor modules and semiconductor devices and particularly to technology employed to cool a power device in the semiconductor module.

BACKGROUND ART

Conventionally there have been proposed a large number of structures for efficiently cooling semiconductor elements in semiconductor modules. For example, the Japan Institute of Invention and Innovation discloses in its published Technology Report No. 2003-504490 a structure having a heat sink immersed in a coolant liquid or similar fluid to cool a power device. This power device includes a power device and a heat sink arranged at opposite surfaces of the power device and immersed in a coolant fluid.

This power device has the heat sink formed in a recessed, curve surface with a plurality of protrusions thereon to have an increased surface area to cool the power device, and also pass the coolant turbulently to more efficiently cool the power device.

Japanese Patent Laying-Open No. 7-189684 discloses a heat exchange device having radiating fins arranged at a density varied in accordance with how air blown by a fan for cooling distributes in flow rate. This heat exchange device has the radiating fins spaced closer for a high-rate air flow area of a radiator and farther away for a low-rate air flow area of the radiator. This allows the radiator to thereacross have a substantially uniform amount of air passing therethrough to achieve an increased heat exchange rate.

As disclosed in Technology Report No. 2003-504490, however, the structure is intended to more effectively cool the entirety of the power device. It is not intended to enable the power device to have a uniform temperature profile.

In general, a power device is higher in temperature at the center than the periphery. Accordingly, how the device increases in temperature at the center is considered in limiting in amount an electric current passed to the power device. As such, power devices higher in temperature at the center than the periphery cannot exhibit their capabilities sufficiently.

In other words, to allow a power device to sufficiently exhibit its performance, it is important to cool the power device more efficiently and as uniformly as possible.

Furthermore, if the power device does not have a uniform temperature profile, the power device's interior, a material bonding the power device and an electrode together, and the like have stress caused therein and helping them to deteriorate. Japanese Patent Laying-Open No. 7-189684 and Technology Report No. 2003-504490 fail to consider such disadvantage.

DISCLOSURE OF THE INVENTION

The present invention has been made to overcome such disadvantage and it contemplates a semiconductor module and semiconductor device allowing a power device to be uniformly cooled.

The present semiconductor module includes: a semiconductor element; and a heat sink disposed between the semiconductor element and a cooling element cooling the semiconductor element, and smaller in thickness at a portion adjacent to the semiconductor element substantially at a center than at a periphery.

The present semiconductor module has the heat sink smaller in thickness at a portion adjacent to the semiconductor element substantially at the center than at a periphery. Thus the heat sink is smaller in thermal resistance at the portion adjacent to the semiconductor element substantially at the center than at the periphery.

Thus in the present invention the semiconductor element can be cooled more efficiently substantially at the center than the periphery and thus have a uniform temperature profile. As a result, the semiconductor element can sufficiently exhibit its capability. Furthermore as the semiconductor element can have a uniform temperature profile the semiconductor element's interior, a material bonding the semiconductor element and an electrode together, and the like can be prevented from having stress caused therein and helping them to deteriorate.

Preferably the heat sink is formed of a conductor and also connected to an electrode of the semiconductor element.

In the present semiconductor module the heat sink can also act as an electrode of the semiconductor module. Thus the semiconductor module can be reduced in size.

Furthermore the present semiconductor device includes: a semiconductor element; and a cooling element including a plurality of radiating fins configured to radiate heat over a larger area at a portion opposite the semiconductor element in a vicinity of a center than at a periphery.

The present semiconductor device includes the cooling element having the plurality of radiating fins configured to radiate heat over a larger area at a portion opposite the semiconductor element in a vicinity of a center than at a periphery. The fins can provide larger heat radiation for the semiconductor element in the vicinity of the center than at the periphery.

Thus in the present invention the semiconductor element can be cooled more efficiently substantially at the center than the periphery and thus have a uniform temperature profile. As a result, the semiconductor element can internally have a uniform current density and sufficiently exhibit its capability. Furthermore as the semiconductor element can have a uniform temperature profile the semiconductor element's interior, a material bonding the semiconductor element and an electrode together, and the like can be prevented from having stress caused therein and helping them to deteriorate.

Preferably the plurality of radiating fins is arranged more densely at the portion opposite the semiconductor element in the vicinity of the center than at the periphery.

The present semiconductor device can have radiating fins arranged more densely at a location opposite the semiconductor element in the vicinity of the center than at the periphery. As such, the fins can provide larger heat radiation for the semiconductor element in the vicinity of the center than at the periphery. Thus the present semiconductor device allows a simple configuration to be used to allow the semiconductor element to have a uniform temperature profile.

Still preferably the plurality of radiating fins are each a fin in a form of a plate; and the plurality of radiating fins located opposite the semiconductor element in the vicinity of the center are spaced closer than those located opposite the semiconductor element at the periphery.

Thus the present semiconductor device allows a significantly simple configuration to be used to allow the semiconductor element to have a uniform temperature profile.

Furthermore, preferably the radiating fins opposite the semiconductor element at the periphery are a plurality of fins each in a form of a plate and the radiating fins opposite the semiconductor element in the vicinity of the center are a plurality of pin fins.

The present semiconductor device can have the plurality of pin fins contacting a coolant over a larger area than the plurality of plate fins. Thus the present semiconductor device allows a simple configuration to be used to allow the semiconductor element to have a uniform temperature profile.

Furthermore, preferably the plurality of radiating fins are each a fin in a form of a plate and the fin in the form of the plate opposite the semiconductor element in the vicinity of the center has a surface having a protrusion and a depression.

The plurality of plate fins having a surface with a protrusion and a recess can contact a coolant over a larger area than that without such protrusion and recess. As such, the fins can provide larger heat radiation for the semiconductor element in the vicinity of the center than at the periphery. Thus the present semiconductor device allows a simple configuration to be used to allow the semiconductor element to have a uniform temperature profile.

Furthermore the present semiconductor device includes: a semiconductor element; a cooling element cooling the semiconductor element; and a heat sink disposed between the semiconductor element and the cooling element and smaller in thickness at a portion adjacent to the semiconductor element substantially at a center than at a periphery. The heat sink at a surface facing the semiconductor element has a flat plane. The heat sink at a surface opposite the cooling element at a portion opposite the semiconductor element substantially at the center is recessed to be minimized in thickness at a portion facing away from the semiconductor element substantially at the center. The cooling element at a surface opposite the heat sink is formed to geometrically match a surface of the heat sink.

In the present semiconductor device the cooling element at a surface opposite the heat sink is formed to geometrically match a surface of the heat sink. This can help to position the cooler and the heat sink and thus better assemble the semiconductor device.

Preferably the cooling element includes a path for a coolant and the path is formed to geometrically match a surface of the heat sink.

The present semiconductor device can have the cooling element with the coolant path formed to be geometrically match a surface of the heat sink having a recessed geometry. Thus the coolant does not flow uniformly or flows turbulently to enhance a surface effect of the coolant at a surface of the coolant path to more effectively cool the element.

Preferably the heat sink is recessed to be streamlined along the coolant's passage.

In the present semiconductor device the coolant path disposed along the geometry of a surface of the heat sink is streamlined along the geometry of the surface of the heat sink. This can contribute to a reduced pressure loss of the coolant flowing through the path. Furthermore, the coolant flows at an increased rate at a location corresponding to the heat sink's recessed geometry. Thus the present semiconductor device allows the semiconductor element to be cooled further more efficiently.

Preferably the cooling element includes a plurality of radiating fins configured to radiate heat over a larger area at a portion opposite the semiconductor element in a vicinity of the center than at the periphery.

The present semiconductor device can have an effect attributed to the heat sink smaller in thickness at a portion adjacent to the semiconductor element in the vicinity of the center than at a periphery and an effect attributed to the cooling element radiating heat over a larger area from the semiconductor element in the vicinity of the center than at the periphery, and these effects can synergetically act to cool the semiconductor element more effectively in the vicinity of the center than at the periphery.

Thus the present semiconductor device also allows a semiconductor element having a significantly large difference in temperature between the vicinity of the center and the periphery to have a uniform temperature profile.

Thus in the present invention the semiconductor element can be cooled more efficiently substantially at the center than at the periphery. The semiconductor element can have a uniform temperature profile and as a result does not have imposed thereon a limitation of a current that is attributed to a locally heated portion caused in the semiconductor element, and hence can sufficiently exhibit its capability.

Furthermore in the present invention as the semiconductor element can have a uniform temperature profile the semiconductor element's interior, a material bonding the semiconductor element and an electrode together, and the like can be prevented from having stress caused therein and helping them to deteriorate.

BEST MODES FOR CARRYING OUT THE INVENTION

Hereinafter the present invention in embodiments will be described more specifically with reference to the drawings. In the figures, identical or like components are identically denoted.

Figure 1:
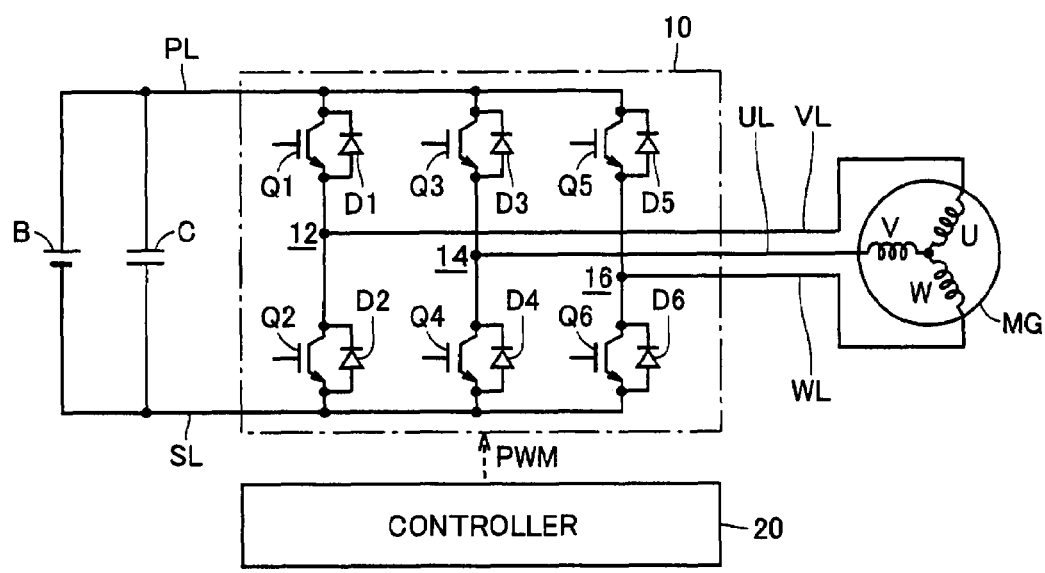
FIG. 1 is a block diagram schematically showing a load drive circuit including an inverter employing a semiconductor module of a first embodiment of the present invention.

FIG. 1 is a block diagram schematically showing a load drive circuit including an inverter employing a semiconductor module of a first embodiment of the present invention. With reference to the figure, a load drive circuit 100 includes a battery B, a capacitor C, an inverter 10, a controller 20, a power supply line PL and a grounding line SL, and a U phase line UL, a V phase line VL and a W phase line WL. Inverter 10 is connected via power supply line PL and grounding line SL to battery B. Furthermore, inverter 10 is connected via U, V and W phase lines UL, VL and WL to a motor generator MG.

Load drive circuit 100 drives motor generator MG, which is implemented for example by a 3-phase alternate current (ac) synchronous motor. Motor generator MG in a powering operation generates a drive torque on 3-phase ac voltage received from inverter 10 via U, V and W phase lines UL, VL and WL, and in a regenerative operation generates and outputs 3-phase ac voltage via U, V and W phase lines UL, VL and WL to inverter 10.

Battery B is a direct current (dc) power supply and implemented for example by 10, a nickel metal hydride, lithium ion or like, secondary battery. Battery B generates a dc voltage which is in turn output on power supply line PL to inverter 10. Furthermore, battery B receives on power supply line PL a dc voltage generated by motor generator MG and rectified by inverter 10 and is charged with the received dc voltage.

Inverter 10 includes a U phase arm 12, a V phase arm 14 and a W phase arm 16 connected in parallel between power supply line PL and grounding line SL. U phase arm 12 is formed of series connected power transistors Q1 and Q2. V phase arm 14 is formed of series connected power transistors Q3 and Q4. W phase arm 16 is formed of series connected power transistors Q5 and Q6. Each power transistor Q1-Q6 is formed for example of an insulated gate bipolar transistor (IGBT). Power transistors Q1-Q6 between their respective collectors and emitters have diodes D1-D6, respectively, connected to pass a current from their respective emitters to their respective collectors. U, V, W phase arms 12, 14, 16 are connected to those ends of the U, V, W phase coils, respectively, of motor generator MG which are opposite the neutral point.

Inverters 10 is operative in response to a signal PWM received from controller to convert dc voltage received on power supply line PL to 3-phase ac voltage to drive motor generator MG. Thus motor generator MG is driven to generate a torque designated by a torque control value. Furthermore, inverter 10 with motor generator MG in the regenerative operation converts 3-phase ac voltage generated by motor generator MG to dc voltage in response to signal PWM received from controller 20 and outputs the dc voltage on power supply line PL.

Capacitor C is connected between power supply line PL and grounding line SL to smooth variation in voltage between power supply line PL and grounding line SL. Controller 20 operates in accordance with a voltage between power supply line PL and grounding line SL and a motor current and a torque control value of motor generator MG to generate signal PWM for driving motor generator MG and output signal PWM to inverter 10.

Figure 2:
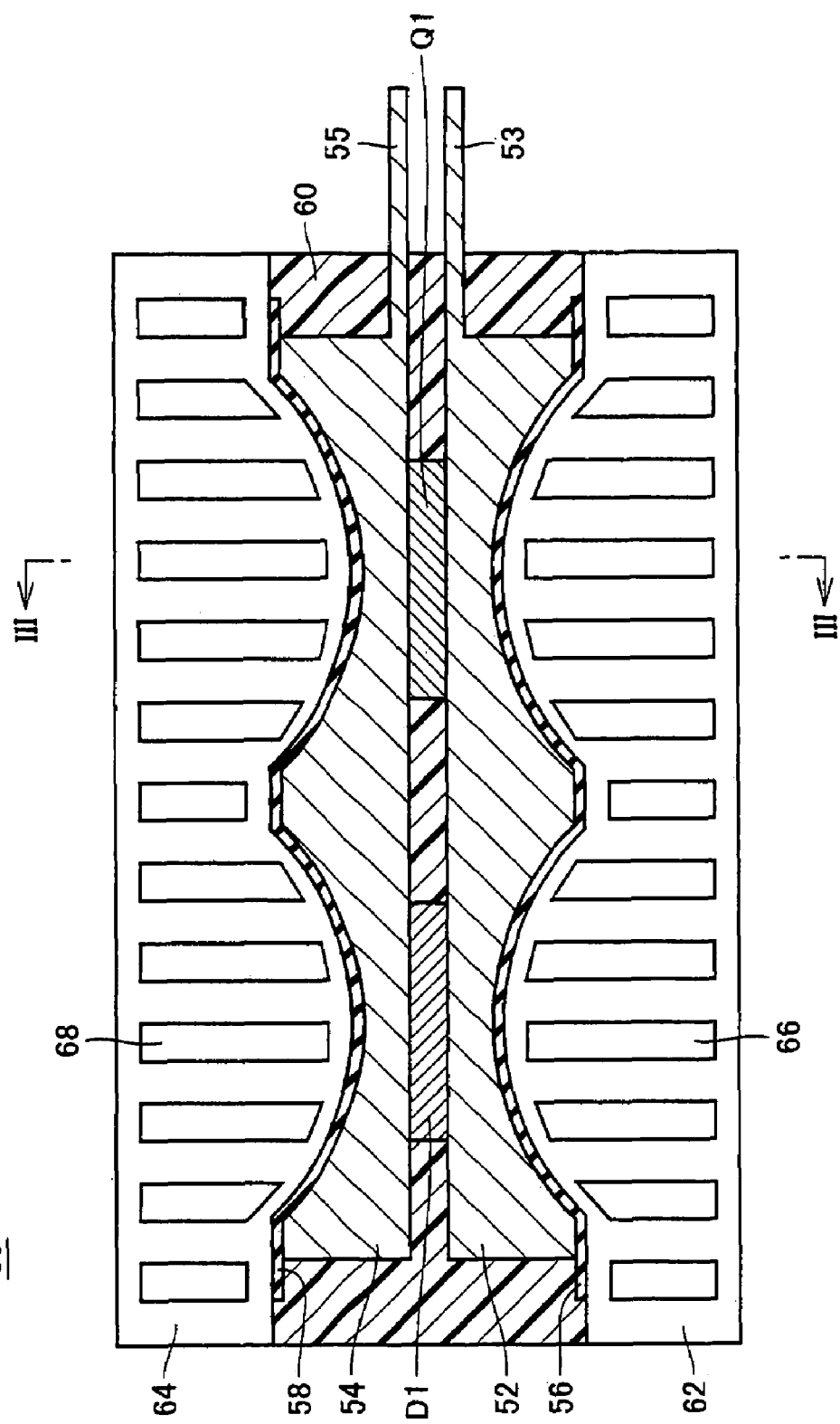
FIG. 2 is a cross section of a structure of a semiconductor module forming a U phase, upper arm of the inverter shown in FIG. 1.
Figure 3:
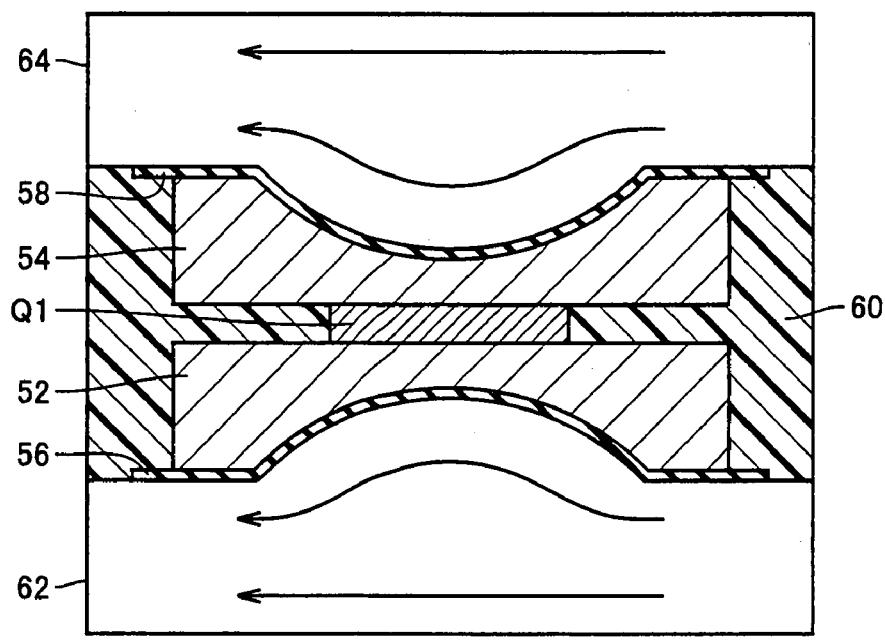
FIG. 3 shows the semiconductor module of FIG. 2 at a cross section III-III.

FIGS. 2 and 3 show a structure of a semiconductor module forming each of upper and lower arms of each of U, V and W phase arms of inverter 10 shown in FIG. 1. FIG. 2 is a cross section of a structure of the semiconductor module forming the U phase, upper arm of inverter 10 shown in FIG. 1, and FIG. 3 is a cross section of the FIG. 2 semiconductor module at a cross section III-III. Note that each of the upper and lower arms of each of U, V, W phase arms of inverter 10 is identical in structure, and FIGS. 2 and 3 representatively show the U phase, upper arm of inverter 10.

With reference to FIGS. 2 and 3, a semiconductor module 50 includes a power transistor Q1, a diode D1, electrodes 52 and 54, insulation plates 56 and 58, and a resin mold 60. Furthermore, cooling elements 62 and 64 are arranged to sandwich semiconductor module 50.

Power transistor Q1 and diode D1 are flat power devices. When they conduct, they generate more heat at the center than the periphery.

Electrode plates 52 and 54 sandwiches power transistor Q1 and diode D1. Electrode plate 52 is connected via a terminal 53 to power supply line PL shown in FIG. 1 and electrode plate 54 is connected via a terminal 55 to U phase line UL shown in FIG. 1. Electrode plate 52, 54 is formed for example of copper, which has high electrical and thermal conductance, and acts as an electrode as well as a heat sink transferring heat from power transistor Q1 and diode D1 to cooling elements 62, 64, respectively.

Herein, electrode plate 52 at a portion adjacent to power transistor Q1 has a surface opposite cooling element 62 and generally spherical so that electrode plate 52 is smaller in thickness at a portion adjacent to power transistor Q1 substantially at the center than a portion adjacent to power transistor Q1 at the periphery. Furthermore, electrode plate 52 at a portion adjacent to diode D has a surface opposite cooling element 62 and generally spherical so that electrode plate 52 is smaller in thickness at a portion adjacent to diode D substantially at the center than a portion adjacent to diode D at the periphery. In other words, electrode plate 52 is formed to be lower in thermal resistance at a portion adjacent to power transistor Q1 and diode D1 substantially at the center than at the periphery.

Furthermore, electrode plate 54 at a portion adjacent to power transistor Q1 also has a surface opposite cooling element 64 and generally spherical so that electrode plate 54 is smaller in thickness at a portion adjacent to power transistor Q1 substantially at the center than a portion adjacent to power transistor Q1 at the periphery. Furthermore, electrode plate 54 at a portion adjacent to diode D also has a surface opposite cooling element 64 and generally spherical so that electrode plate 54 is smaller in thickness at a portion adjacent to diode D substantially at the center than a portion adjacent to diode D at the periphery. In other words, electrode plate 54 is also formed to be lower in thermal resistance at a portion adjacent to power transistor Q1 and diode D1 substantially at the center than at the periphery.

Insulation plate 56 is disposed between electrode plate 52 and cooling element 62 to insulate electrode plate 52 and cooling element 62 from each other. Insulation plate 58 is disposed between electrode plate 54 and cooling element 64 to insulate electrode plate 54 and cooling element 64 from each other. Insulation plate 56, 58 contains alumina or a similar, highly thermally conductive filler and transfers heat from electrodes 52 and 54 to cooling elements 62 and 64, respectively, against small thermal resistance.

Resin mold 60 is formed for example of epoxy resin. It fixes and seals power transistor Q1, diode D1, electrode plates 52 and 54, and insulation plates 56 and 58 integrally.

Cooling elements 62 and 64 are formed for example of aluminum, which is highly thermally conductive, and cools semiconductor module 50 formed of power transistor Q1, diode D1, electrode plates 52 and 54, insulation plates 56 and 58, and resin mold 60, on opposite sides. Cooling element 62 is disposed geometrically along electrode plate 52 in close contact with insulation plate 56 and internally has a coolant path 66. Cooling element 64 is disposed geometrically along electrode plate 54 in close contact with insulation plate 58 and internally has a coolant path 68. Coolant paths 66 and 68 are also formed to geometrically match electrode plates 52 and 54, respectively.

Figure 4:
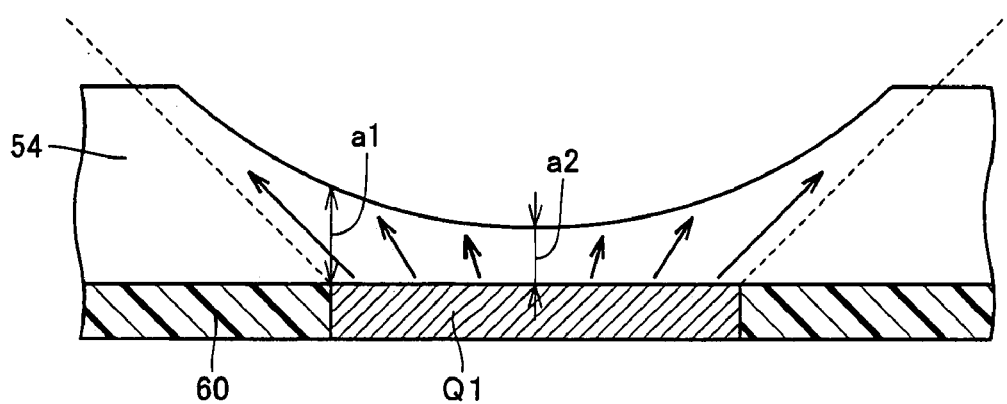
FIG. 4 is an enlarged view in a vicinity of a portion of an electrode plate shown in FIG. 2 that is bonded to a power transistor.

FIG. 4 is an enlarged view in a vicinity of that portion of electrode plate 54 shown in FIG. 2 which is bonded to power transistor Q1. Note that that portion of electrode plate 54 which is bonded to diode D1 and that of electrode 52 which is bonded to power transistor Q1 and diode D1 are also structurally identical to that of electrode 54 which is bonded to power transistor Q1, as shown in FIG. 4. Accordingly, FIG. 4 shows that portion of electrode plate 54 which is bonded to power transistor Q1 representatively.

With reference to FIG. 4, electrode plate 54, acting as a heat sink, at a portion adjacent to power transistor Q1 at a periphery has a thickness a1 and at a portion adjacent to power transistor Q1 substantially at the center has a thickness a2 smaller than thickness a1.

The portion adjacent to power transistor Q1 substantially at the center is smaller in thickness than that adjacent to power transistor Q1 at the periphery in order to allow power transistor Q1 to have a profile in temperature uniform between substantially the center and the periphery. More specifically, power transistor Q1 generates a larger amount of heat substantially at the center than at the periphery. Reducing the portion adjacent to power transistor Q1 substantially at the center to be smaller in thickness than that adjacent to power transistor Q1 at the periphery allows power transistor Q1 substantially at the center to have a reduced distance to the cooling element. Thus the portion adjacent to power transistor Q1 substantially at the center can be smaller in thermal resistance than that adjacent to power transistor Q1 at the periphery to allow the portion adjacent to power transistor Q1 substantially at the center to contribute to more effectively cooling power transistor Q1. Thus power transistor Q1 can be uniform in temperature between substantially the center and the periphery.

To more effectively cool power transistor Q1 substantially at the center, electrode plate 54 may uniformly be reduced in thickness. However, heat from power transistor Q1 diffuses to electrode plate 54 radially, as shown in FIG. 4, and if electrode plate 54 is also reduced in thickness at a periphery of power transistor Q1, electrode plate 54 has heat diffusing in a reduced width, inviting increased thermal resistance of electrode plate 54. Accordingly at the periphery of power transistor Q1 an increased thickness of electrode plate 54 is ensured.

Furthermore, electrode plate 54 that is not reduced uniformly in thickness and instead smaller in thickness at a portion adjacent to power transistor Q1 substantially at the center than that adjacent to power transistor Q1 at the periphery allows cooling element 64 to further more effectively cool power transistor Q1 for the following reason: as shown in FIG. 3, cooling element 64 at a portion opposite power transistor Q1 is formed to have a generally spherical surface along electrode plate 54 in geometry and therealong the coolant flows. Thus at the portion opposite power transistor Q1 the coolant flows at an increased rate. Furthermore, the coolant does not flow uniformly. Thus the coolant flows turbulently, and the coolant path and coolant's surface effect can be improved. Cooling element 64 can thus cool power transistor Q1 more effectively.

While in the above description electrode plate 52, 54 at a portion adjacent to power transistor Q1 and diode D1 is formed to have a generally spherical surface, electrode plate 52, 54 at such portion may be formed to have a generally hyperboloidal surface, a generally paraboloidal surface or a similar surface to have a minimum thickness at a portion adjacent to power transistor Q1 and diode D1 substantially at the center. Such generally spherical, hyperbolaidal, paraboloidal and similar, streamlined surfaces can minimize the coolant's pressure loss and prevent impaired efficiency in cooling the device.

Thus in the first embodiment electrode plate 52, 54, acting as a heat sink, at a portion adjacent to power transistor Q1 and diode D1 substantially at the center is smaller in thickness than at a portion adjacent to power transistor Q1 and diode D1 at a periphery to reduce the former portion to be smaller in thermal resistance than the latter portion. Power transistor Q1 and diode D1 can be cooled more effectively substantially the center than the periphery and thus have a uniform temperature profile. Thus the capability of power transistor Q1 and that of diode D1 can effectively be utilized.

Furthermore, cooling element 62, 64 that is formed to geometrically match a surface of electrode plate 52 can be readily positioned in semiconductor module 50. The semiconductor device formed of semiconductor module 50 and cooling element 62, 64 can better be assembled.

Furthermore, cooling element 62, 64 can internally have coolant path 66, 68 also formed to geometrically match a surface of electrode plate 52. This allows the coolant to flow at an improved rate at the portion opposite power transistor Q1 and diode D1 substantially at the center and also provides an improved surface effect between the coolant and the coolant path. Thus power transistor Q1 and diode D1 can be cooled more efficiently.

Furthermore, electrode plate 52, 54 having a portion adjacent to power transistor Q1 and diode D1 that is formed to be streamlined in a direction in which cooling element 62, 64 passes the coolant, can contribute to a reduced pressure loss of the coolant in cooling element 62, 64 and hence less impaired efficiency in cooling the devices.

Second Embodiment

Figure 5:
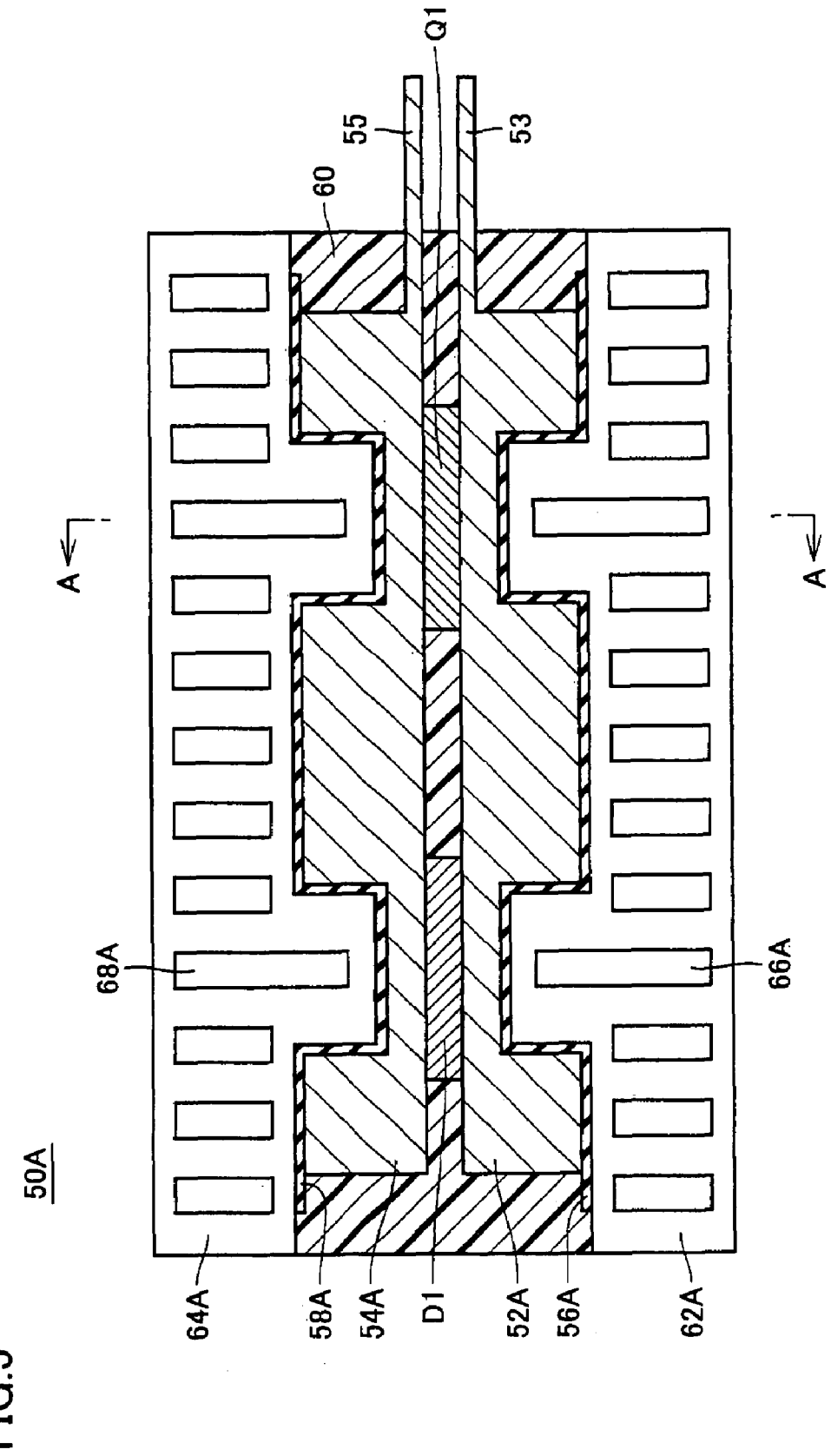
FIG. 5 is a cross section of a structure of a semiconductor module of a second embodiment of the present invention.

FIG. 5 is a cross section of a structure of a semiconductor module in a second embodiment of the present invention. Note that a load drive device including an inverter employing the semiconductor module of the second embodiment has the same circuit configuration as the FIG. 1 load drive circuit 100. Furthermore in the second embodiment each of upper and lower arms of each of U, V and W phase arms of the inverter is identically structured and accordingly FIG. 5 shows a structure of the U phase, upper arm of the inverter representatively. Furthermore FIG. 5 corresponds to FIG. 2 described in the first embodiment.

With reference to FIG. 5, a semiconductor module 50A corresponds in configuration to semiconductor module 50 described in the first embodiment with reference to FIG. 2 having electrode plates 52 and 54 and insulation plates 56 and 58 replaced with electrode plates 52A and 54A and insulation plates 56A and 58A.

Electrode plate 52A differs in geometry from electrode 52 described in the first embodiment with reference to FIG. 2 in that the former at that surface opposite cooling element 62A and facing away from power transistor Q1 and diode D1 is formed to have a generally cylindrically curved surface. More specifically, semiconductor module 50A as seen in a cross section A-A is as shown in FIG. 3 and at the portion facing away from power transistor Q1 and diode D1 has a surface generally cylindrically curved in a direction in which cooling element 62 internally passes the coolant.

Furthermore, electrode 54A has a geometry similar to electrode plate 52A and at a portion facing away from power transistor Q1 and diode D1 has a surface generally cylindrically curved in a direction in which cooling element 64A internally passes the coolant.

Insulation plate 56A is disposed between electrode plate 52A and cooling element 62A along that surface of electrode plate 52A which is opposite to cooling element 62A. Insulation plate 58A is disposed between electrode plate 54A and cooling element 64A along that surface of electrode plate 54A which is opposite to cooling element 64A.

It should be noted that as shown in FIG. 5 electrode plate 52A, 54A preferably has a recess having a width within that of the device or power transistor Q1 and diode D1 in order to more effectively cool power transistor Q1 and diode D1 substantially at the center, while allowing heat generated from power transistor Q1 and diode D1 to diffuse in electrode plate 52A, 54A across a larger area to reduce electrode plate 52A, 54A in thermal resistance.

Cooling element 62A is provided geometrically along electrode plate 52A in close contact with insulation plate 56A and cooling element 64A is provided geometrically along electrode plate 54A in close contact with insulation plate 58A.

Semiconductor module 50A also has electrode plate 52A, 54A acting as a heat sink and smaller in thickness at a portion adjacent to power transistor Q1 and diode D1 substantially at the center than that adjacent to power transistor Q1 and diode D1 at the periphery. Power transistor Q1 and diode D1 can each be cooled more effectively substantially at the center of the device than the periphery of the device. The device can have a uniform temperature profile between substantially at the center and the periphery.

Furthermore, cooling element 62A, 64A at a portion opposite power transistor Q1 and diode D1 is formed to have a generally cylindrically curved surface along electrode plate 52A, 54A in geometry and therealong the coolant flows. Thus at the portion opposite power transistor Q1 and diode D1 the coolant flows at an increased rate. Furthermore, the coolant flows effectively turbulently, and the coolant path and coolant's surface effect can be improved. Cooling element 62A, 64A can thus cool power transistor Q1 and diode D1 more effectively.

Thus the second embodiment can also provide an effect similar to that of the first embodiment.

Figure 6:
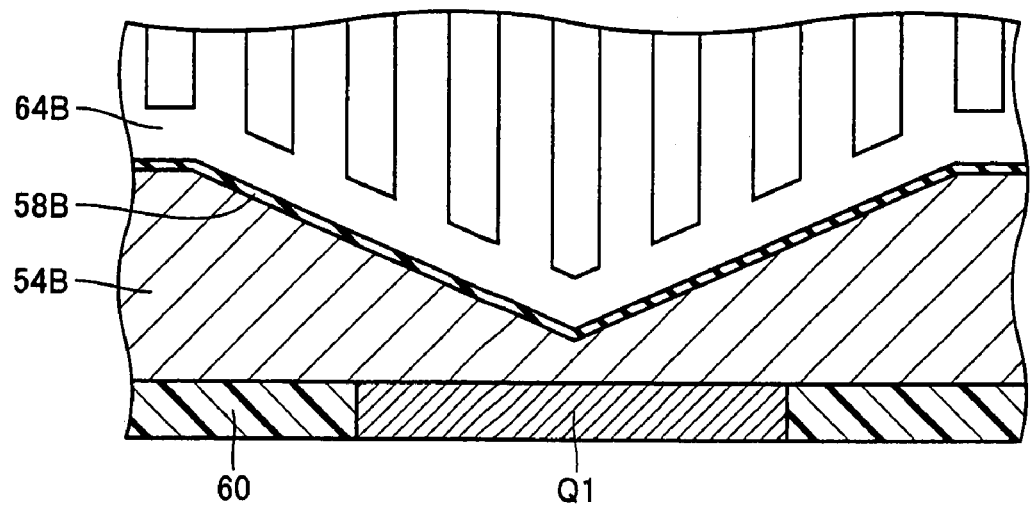
FIG. 6 is a cross section of another structure of the present semiconductor module.
Figure 7:
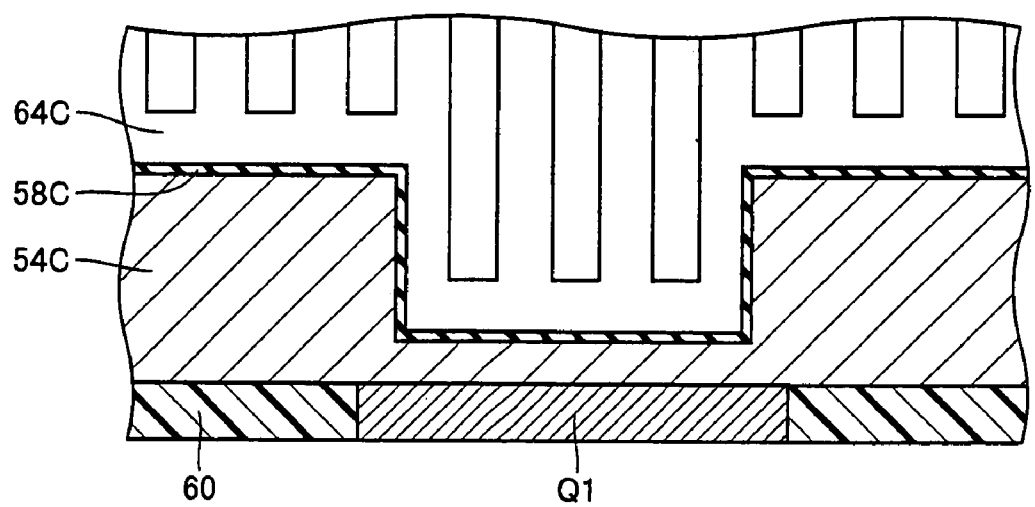
FIG. 7 is a cross section of a still another structure of the present semiconductor module.

Note that the present semiconductor module's electrode plate (or heat sink) is not limited in geometry to those of the first and second embodiments. For example the electrode plate (or heat sink) at a surface opposite a cooling element and facing away from a power transistor (or a diode) may be formed to have a generally conical geometry as shown in FIG. 6 or a generally rectangular geometry as shown in FIG. 7.

Third Embodiment

Figure 8:
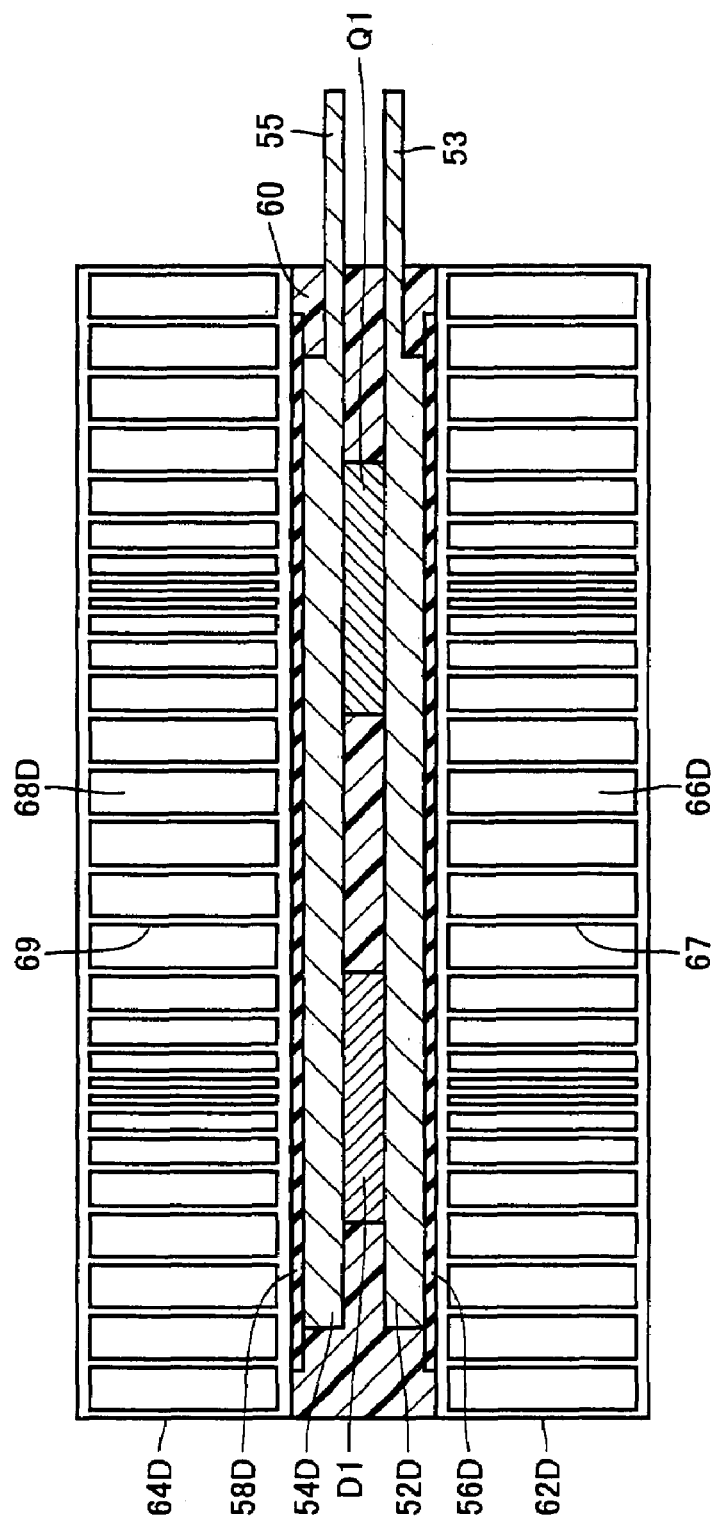
FIG. 8 is a cross section of a structure of a semiconductor device in a third embodiment of the present invention.

FIG. 8 is a cross section of a structure of a semiconductor device in a third embodiment of the present invention. With reference to the figure, a semiconductor device 51 includes power transistor Q1, diode D1, an electrode plate 52D, 54D, an insulation plate 56D, 58D, a resin mold 60, and a cooling element 62D, 64D.

Electrode plates 52D and 54D are disposed to sandwich power transistor Q1 and diode D1. In the third embodiment electrode plate 52D, 54D does not have such a geometry of electrode 52, 54 as described in the first embodiment with reference to FIG. 2. Rather, it is a typical, flat plate. Electrode plate 52D, 54D, as well as electrode plate 52, 54, is formed of a highly electrically and thermally conductive material, such as copper. Electrode plates 52D and 54D acts as electrodes as well as heat sinks transferring heat from power transistor Q1 and diode D1 to cooling elements 62D and 64D, respectively.

Insulation plate 56D is disposed between electrode plate 52D and cooling element 62D to insulate electrode plate 52D and cooling element 62D from each other. Insulation plate 58D is disposed between electrode plate 54D and cooling element 64D to insulate electrode plate 54D and cooling element 64D from each other.

Cooling element 62D is implemented by a micro channel cooler having a plurality of coolant paths 66D and a plurality of radiating fins 67 each in the form of a plate. Cooling element 62D is disposed in close contact with insulation plate 56D. More specifically, cooling element 62D at a surface contacting insulation plate 56D has a flat geometry along that of electrode plate 52D. Cooling element 64D is implemented by a micro channel cooler having a plurality of coolant paths 68D and a plurality of radiating fins 69 each in the form of a plate. Cooling element 64D is disposed in close contact with insulation plate 58D. More specifically, cooling element 64D at a surface contacting insulation plate 58D has a flat geometry along that of electrode plate 54D.

Cooling element 62D (or 64D) has the plurality of radiating fins 67 (or 69) spaced closer at a location opposite each of power transistor Q1 and diode D1 (hereinafter also simply referred to as a "power device") in a vicinity of the center than at a periphery. More specifically, the fins are arranged more densely at the location opposite the power device in the vicinity of the center than at the periphery.

Cooling element 62D, 64D having radiating fins that can radiate heat over a larger area at the location opposite the power device in the vicinity of the center than at the periphery, allows larger heat radiation from the power device in the vicinity of the center than at the periphery. In other words, the power device can be cooled more effectively in the vicinity of the center than at the periphery. Thus the power device can be uniform in temperature between substantially at the center and the periphery.

Thus in the third embodiment the power device can be cooled more effectively in the vicinity of the center than at the periphery. Thus the power device can have a uniform temperature profile. As a result, the power device can internally have a uniform current density and thus exhibit its capability sufficiently.

Furthermore the power device that can have a uniform temperature profile can reduce stress caused in the power device, solder or a similar material (not shown) bonding the power device and an electrode together, and the like and hence reduce their deterioration.

Furthermore, cooling element 62D, 64D at a portion opposite the power device's periphery and that offset from the power device can have a reduced number of radiating fins and thus contribute to a reduced component cost. Furthermore, the reduced number of radiating fins can contribute to a reduced pressure loss of the coolant flowing through coolant path 66D, 68D and the power device can be cooled more efficiently.

Fourth Embodiment

Figure 9:
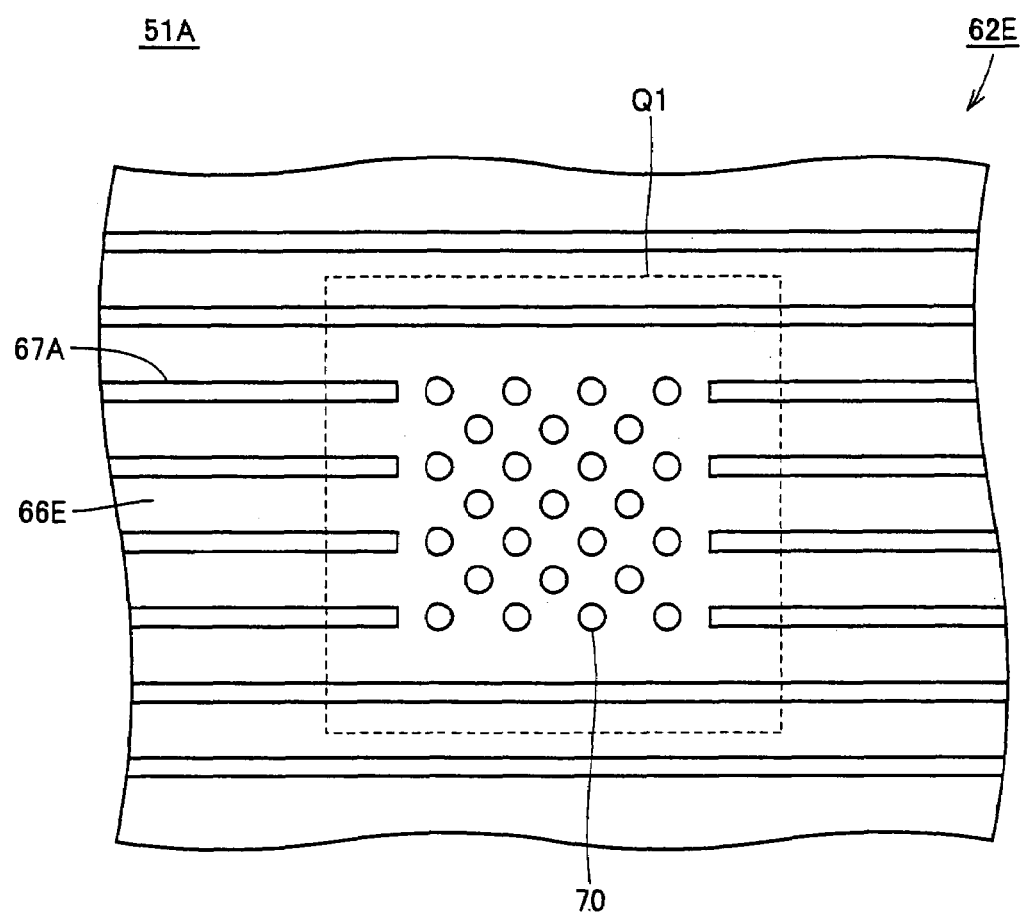
FIG. 9 is a cross section of a structure of a cooling element in a semiconductor device of a fourth embodiment of the present invention.

FIG. 9 is a cross section of a structure of a cooling element in a semiconductor device of a fourth embodiment of the present invention. The figure shows the cooling element in a cross section parallel to a plane opposite a power device for the sake of indicating a feature of the semiconductor device in the present embodiment. While FIG. 9 representatively shows a structure in a vicinity of a portion opposite power transistor Q1, that of a portion opposite diode D1 is also identical.

With reference to FIG. 9, the present embodiment provides a semiconductor device 51A having a cooling element 62E implemented by a micro channel cooler including a plurality of coolant paths 66E, a plurality of radiating fins 67A each in the form of a plate, and a plurality of pin fins 70.

The plurality of pin fins 70 is located opposite power transistor Q1 in the vicinity of the center. Each pin fin 70 is a radiator in the form of a pin (or rod) arranged to extend in a direction substantially perpendicular to a plane of the cooling element that is opposite the power device (in FIG. 9, a direction normal to the plane of the sheet of the drawing). At a location opposite power transistor Q1 at the periphery, radiating fins 67A in the form of the plate are disposed.

When the plurality of pin fins 70 arranged in an area is compared with radiating plate fins 67A arranged in an equal area, the former can contact the coolant over a larger area. Thus cooling element 62A allows larger heat radiation from power transistor Q1 for the vicinity of the center opposite the plurality of pin fins 70 than for the periphery. In other words, power transistor Q1 can be cooled more effectively in the vicinity of the center than at the periphery and hence have a uniform temperature profile between the vicinity of the center and the periphery.

Note that as well as power transistor Q1, diode D1 can also have a uniform temperature profile between the vicinity of the center and the periphery.

Thus the fourth embodiment also allows the power device to have a uniform temperature profile. As a result, the power device can internally have a uniform current density and thus exhibit its capability sufficiently.

Fifth Embodiment

Figure 10:
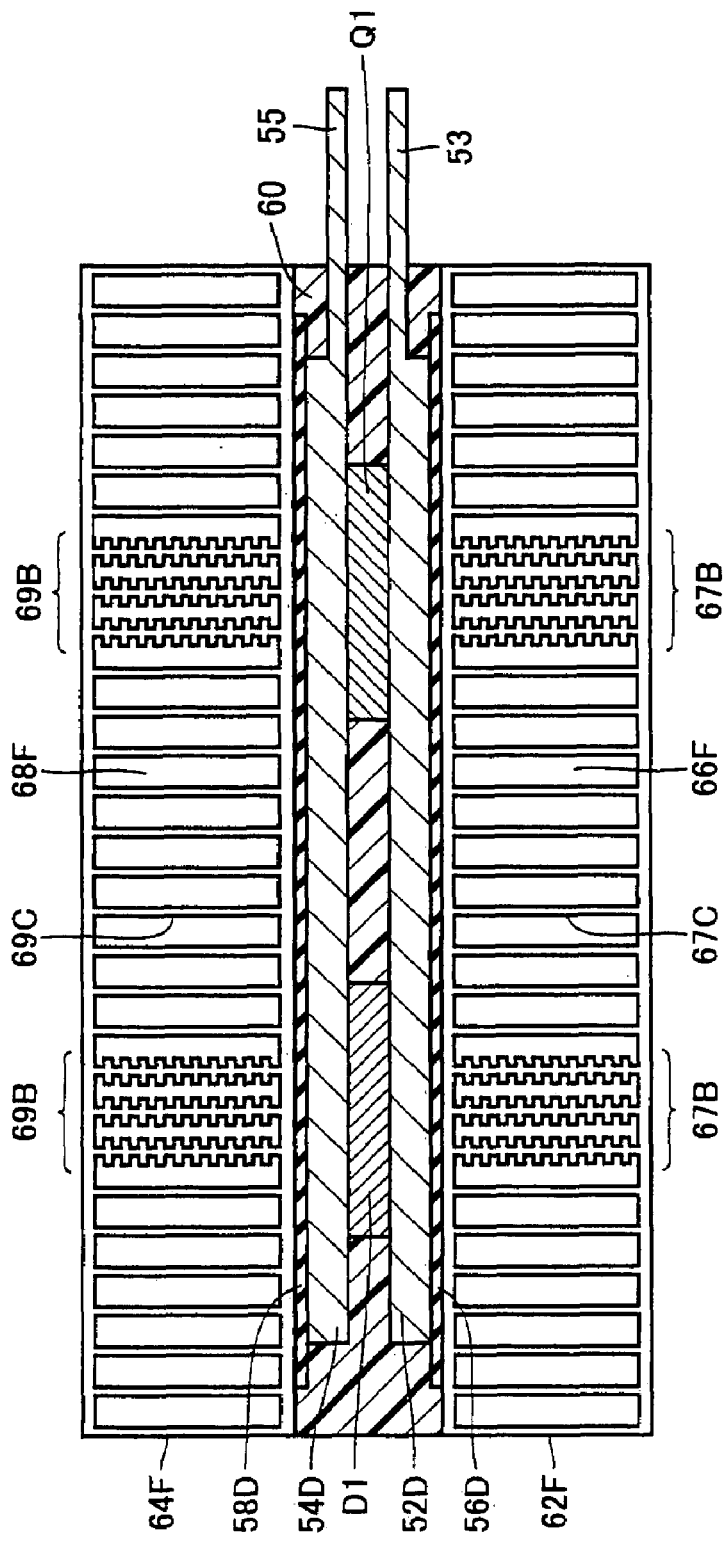
FIGS. 10-12 are cross sections of structures of semiconductor devices of fifth, sixth and seventh embodiments, respectively, of the present invention.

FIG. 10 is a cross section of a structure of a semiconductor device in a fifth embodiment of the present invention. With reference to the figure, a semiconductor module 51B corresponds in configuration to semiconductor device 51 described in the third embodiment with reference to FIG. 8 with cooling elements 62D and 64D replaced with cooling elements 62F and 64F, respectively.

Cooling element 62F is implemented by a micro channel cooler including a plurality of coolant paths 66F and a plurality of radiating fins 67B, 67C each in the form of a plate. Cooling element 62F is disposed in close contact with insulation plate 56D. More specifically, cooling element 62F at a surface contacting insulation plate 56D has a flat geometry along that of electrode plate 52D.

Radiating fin 67B is disposed at a location opposite a power device in the vicinity of the center. Radiating fin 67C is disposed at a different location including that opposite the power device at a periphery. Radiating fin 67B has a surface having recesses and protrusions and for example provided with finer fins to provide larger heat radiation than radiating fin 67C.

Cooling element 64F is implemented by a micro channel cooler including a plurality of coolant paths 68F and a plurality of radiating fins 69B, 69C each in the form of a plate. Cooling element 64F is similar in configuration to cooling element 62F. More specifically, radiating fin 69B disposed at a location opposite the power device in the vicinity of the center provides larger heat radiation than radiating fin 69C disposed at a different location including that opposite the power device at the periphery.

Thus cooling element 62F, 64F can also cool the power device more effectively in the vicinity of the center than at the periphery, and the power device can have a uniform temperature profile between the vicinity of the center and the periphery.

Thus the fifth embodiment also allows the power device to have a uniform temperature profile. As a result, the power device can internally have a uniform current density and thus exhibit its capability sufficiently.

Sixth Embodiment

Figure 11:
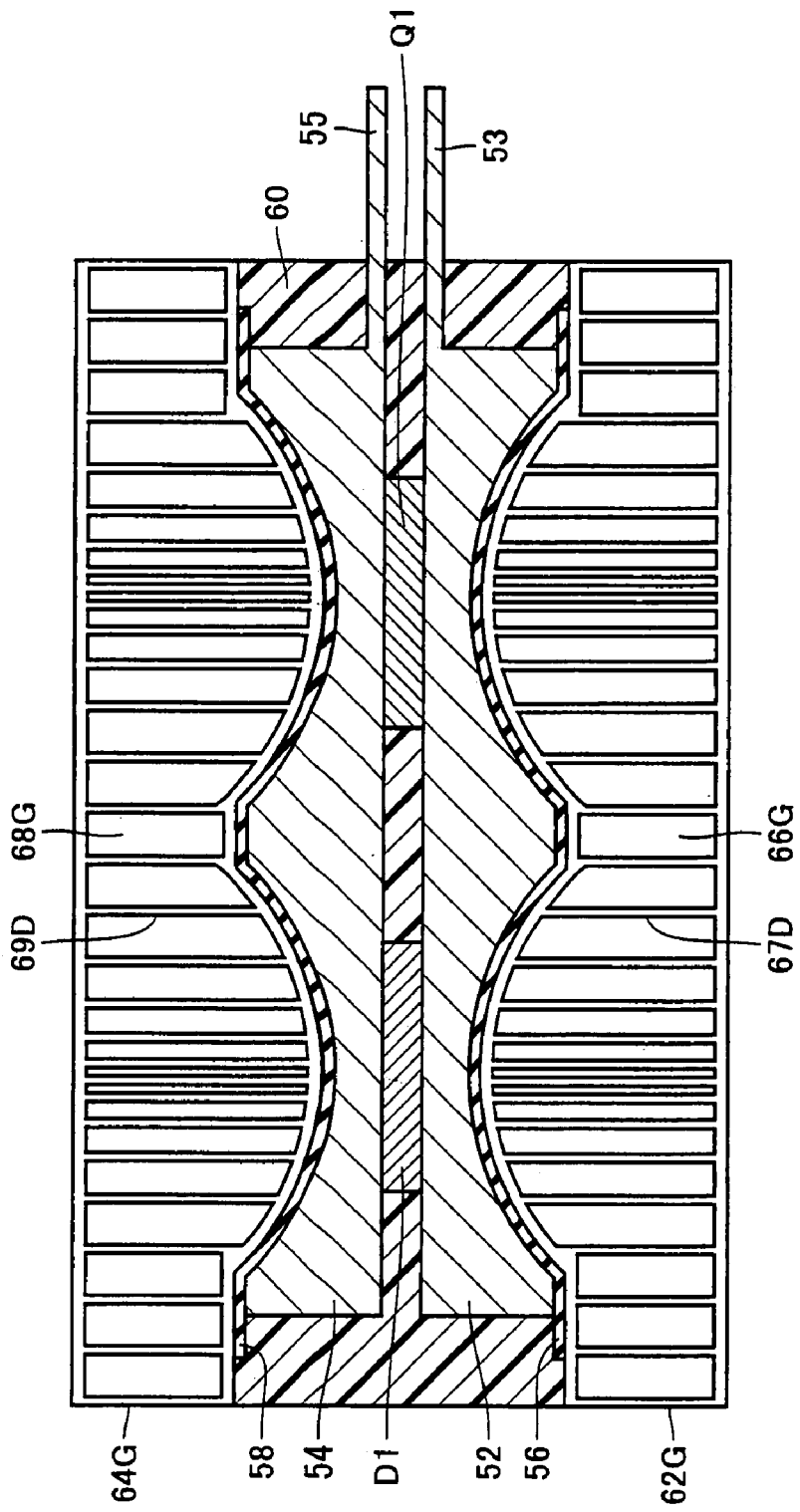

FIG. 11 is a cross section of a structure of a semiconductor device in a sixth embodiment of the present invention. The figure shows a semiconductor device 51C including semiconductor module 50 described in the first embodiment with reference to FIG. 2, and a cooling element 62G, 64G.

Cooling element 62G is implemented by a micro channel cooler having a plurality of coolant paths 66G and a plurality of radiating fins 67D each in the form of a plate. Cooling element 62G is disposed geometrically along electrode plate 52 in close contact with insulation plate 56. Cooling element 64G is implemented by a micro channel cooler having a plurality of coolant paths 68G and a plurality of radiating fins 69D each in the form of a plate. Cooling element 64G is disposed geometrically along electrode plate 54 in close contact with insulation plate 58.

Note that the plurality of radiating fins 67 (or 69) are spaced closer at a location opposite the power device in a vicinity of the center than at a periphery. More specifically, the fins are arranged more densely at the location opposite the power device in the vicinity of the center than at the periphery.

Semiconductor device 51C can have an effect attributed to electrode plate 52, 54 smaller in thickness at a portion adjacent to the power device in the vicinity of the center than that adjacent to the power device at a periphery and an effect attributed to cooling element 62G, 64G radiating heat over a larger area from the power device in the vicinity of the center than at the periphery, and these effects can synergetically act to cool the power device more effectively in the vicinity of the center than at the periphery.

Thus in the sixth embodiment electrode plate 52, 54 can be formed and cooling element 62D, 64D can have a radiating fin configured, as described above, to further more effectively cool the power device in the vicinity of the center. This allows a power device having a significantly large difference in temperature between the vicinity of the center and the periphery to also have a uniform temperature profile.

Seventh Embodiment

Figure 12:
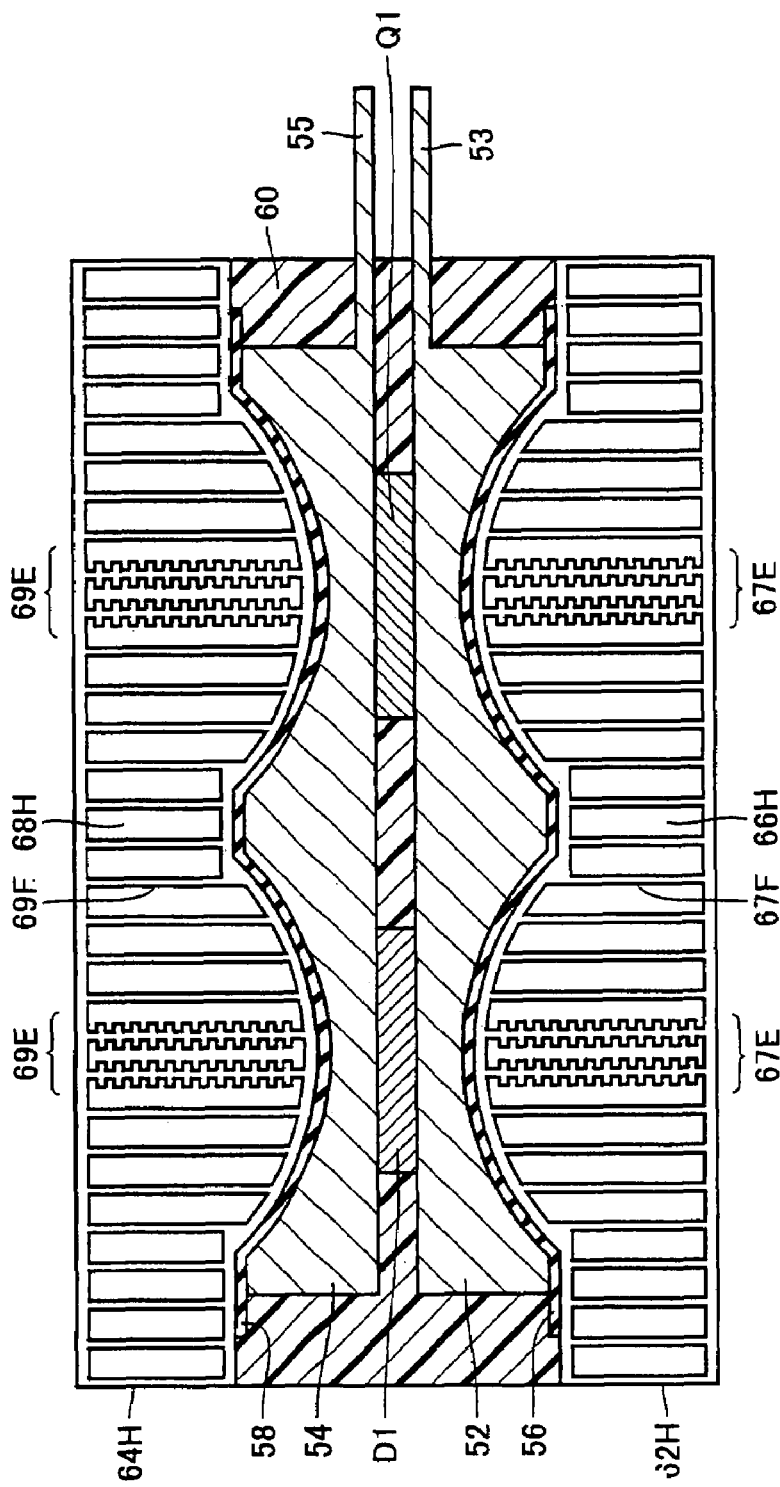

FIG. 12 is a cross section of a structure of a semiconductor device in a seventh embodiment of the present invention. The figure shows a semiconductor device 51D including semiconductor module 50 described in the first embodiment with reference to FIG. 2, and a cooling element 62H, 64H.

Cooling element 62H is implemented by a micro channel cooler including a plurality of coolant paths 66H and a plurality of radiating fins 67E, 67F each in the form of a plate. Cooling element 62H is disposed geometrically along electrode plate 52 in close contact with insulation plate 56. Radiating fin 67E is disposed at a location opposite a power device in the vicinity of the center. Radiating fin 67F is disposed at a different location including that opposite the power device at a periphery. Radiating fin 67E has a surface having recesses and protrusions and for example provided with finer fins to provide larger heat radiation than radiating fin 67F.

Cooling element 64H is implemented by a micro channel cooler including a plurality of coolant paths 68H and a plurality of radiating fins 69E, 69F each in the form of a plate. Cooling element 64H is disposed geometrically along electrode plate 54 in close contact with insulation plate 58. Cooling element 64H is similar in configuration to cooling element 62H. More specifically, radiating fin 69E disposed at a location opposite the power device in the vicinity of the center provides larger heat radiation than radiating fin 69F disposed at a different location including that opposite the power device at the periphery.

Thus semiconductor device 51D, as well as semiconductor device 51C of the sixth embodiment, can have an effect attributed to electrode plate 52, 54 each having a difference in thickness and that attributed to cooling element 62H, 64H each having radiating fins radiating heat over different areas to cool the power device more effectively in the vicinity of the center than at the periphery.

Thus the seventh embodiment also allows a power device to be cooled further more effectively in the vicinity of the center than at the periphery. This allows a power device having a significantly large difference in temperature between the vicinity of the center and the periphery to also have a uniform temperature profile.

While the above description is provided in connection with a semiconductor module having opposite sides cooled and a power device (a power transistor and a diode) sandwiched by electrode plates, the present invention is not limited to such semiconductor module and is also applicable to a semiconductor module having one side cooled.

Furthermore the present invention may be applied to the semiconductor module having opposite sides cooled that has one electrode alone reduced in thickness at a portion adjacent to a power device substantially at the center.

Furthermore while the above description has been provided in connection with a semiconductor module cooled by a cooling element employing a liquid coolant, the present invention is not limited thereto and is also applicable to that cooled by a cooling element employing air to cool the same.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A semiconductor device comprising:
    a semiconductor element; and
    a cooling element including a plurality of radiating fins configured to radiate heat over a larger surface area of the radiating fins at a portion opposite said semiconductor element in a vicinity of a center of the semiconductor element than at a periphery of the semiconductor element, wherein:
    said plurality of radiating fins are each a fin in a form of a plate; and
    the fins at said portion opposite said vicinity of said center of the semiconductor element have a surface having a series of protrusions and depressions.

2. The semiconductor device according to claim 1, wherein said semiconductor element is a switching element.

3. The semiconductor device according to claim 2, wherein:
    said semiconductor device has more than one said switching element; and
    said more than one said switching element configures an inverter circuit.

4. The semiconductor device according to claim 1, wherein said cooling element internally has a path for a coolant.

5. The semiconductor device according to claim 1, wherein the protrusion and the depression of the fin extend from a side surface of the fin that is perpendicular to a top surface of the semiconductor element.

* * * * *